United States Patent [19]

Pinkham et al.

[11] Patent Number: 4,807,189

[45] Date of Patent: Feb. 21, 1989

[54] READ/WRITE MEMORY HAVING A MULTIPLE COLUMN SELECT MODE

[75] Inventors: Raymond Pinkham, Missouri City; Anthony M. Balistreri, Houston, both of Tex.

[73] Assignee: Texas Instruments Incorporated, Dallas, Tex.

[21] Appl. No.: 81,948

[22] Filed: Aug. 5, 1987

[51] Int. Cl.⁴ ..................... G11C 11/40; G11C 13/00
[52] U.S. Cl. ..................... 365/189; 365/230
[58] Field of Search ............ 365/189, 230, 219, 220, 365/221, 231, 235, 238

[56] References Cited

U.S. PATENT DOCUMENTS 4,715,017  12/1987  Iwahashi .......................... 365/189

Primary Examiner—Terrell W. Fears
Attorney, Agent, or Firm—John D. Kling; Leo N. Heiting; Melvin Sharp

[57] ABSTRACT

A dual-port memory having a special operating mode (i.e., a block write mode) by which a plurality of memory cells may be written with the same data in a single write cycle is disclosed. The special mode is enabled by a special function pin in conjunction with the write enable and transfer enable function pins, each of which have their logic state latched in during the row address strobe signal. The column decoder in this device is in two stages, where the first stage selects a group of columns based upon the most significant column address bits. The second stage selects a single column based upon the least significant column address bits. In the block write mode, the result of the second column address decoder stage is ignored, and another set of signals select one, more than one, or all of the columns in the group for connection to the input/output circuitry, so that the same data is written to a plurality of memory locations within a certain column address proximity. The invention may be incorporated into a multiple input/output RAM, so that a plurality of columns, associated with a plurality of inputs, may be written in the same cycle. A color register is also provided to store the data to be written, so that the input terminals can be used to select which ones of the group of columns are to be written to in the block write mode. In the multiple input/output situation, a mask register may be provided to selectively inhibit the writing of certain ones of the inputs. The invention provides for efficient writing of color data to proximate memory locations, such a feature being especially useful in "filling" an area in a bit-mapped image with a given color code.

17 Claims, 9 Drawing Sheets

READ/WRITE MEMORY HAVING A MULTIPLE COLUMN SELECT MODE

This application claims the benefit of prior copending application Ser. No. 053,200, filed on May 21, 1987 by Raymond Pinkham, and assigned to Texas Instruments Incorporated; said prior application discloses material disclosed and claimed in this application.

This application is related to our copending application Ser. No. 081,926 filed Aug. 5, 1987 and assigned to Texas Instruments Incorporated.

The subject invention is in the field of memory devices, specifically dual-port random access semiconductor memory devices as used in graphics applications.

BACKGROUND OF THE INVENTION

With the advent of less expensive semiconductor memory, modern computer and microcomputer systems have been able to use bit-mapped video displays for the output of data from the system. As is well known, a bit-mapped display requires a memory which can store at least one binary digit (bit) of information for each picture element (pixel) of the display device. Additional bits stored for each pixel provide the capability of the system to render complex images on the video display, such as multi-color images, and background and foreground images, such as a graphics background with textual information overlaid thereupon. The use of bit-mapped storage also allows for data processing operations to easily generate and modify the stored image.

Modern video display devices are often of the raster-scan type, where an electron gun traces horizontal lines across the display screen in order to generate the displayed pattern. In order for a displayed raster scan image to continue to be displayed on the video screen, the image must be refreshed at periodic intervals. A common refresh rate for the cathode ray tube video display devices is 1/60 of a second, since the refresh operation carried out at that speed is not noticable to the human user of the system. However, as the number of pixels displayed on a screen increases, in order to increase the resolution of the displayed image, more and more bits of information must be accessed from the bit-mapped memory in the refresh interval. If the bit-mapped memory has but a single input and output port, the percentage of time during which the data processing unit can assess the bit-mapped memory decreases with the pixel size of the display if the refresh interval remains constant. In addition, the speed of the memory must increase, since more bits must be output during a fixed period of time.

Multiport random access memories have been developed which provide for high-speed output of data to the video display and also for increased accessability of the memory contents to the data processing device. The multiport memories accomplish this by having a first port for random access and update of the memory by the data processing unit of the computer system and a second port for serial output of the memory contents to the video display independent from and asynchronous with the first port, thereby allowing access to the memory contents during output of data to the video display terminal. Examples of multiport random access memories are described in U.S. Pat. No. 4,562,435 (issued Dec. 31, 1985), U.S. Pat. No. 4,639,890 (issued Jan. 27, 1987), and U.S. Pat. No. 4,636,986 (issued Jan. 13, 1987), all assigned to Texas Instruments Incorporated.

The multiport random access memory described in said U.S. Pat. No. 4,636,986 has four random access input/output terminals, and four serial access input/output terminals, so that the single memory device appears to have four memory arrays. This allows a single random access to read or write four data bits simultaneously, with a single address value, and also allows a by-four serial output for purposes of data communication to the video display. An external parallel-to-serial register can then receive the four serial output bits, and shift them to the video display at the display refresh rate; this allows the memory register to shift at one-fourth the rate of the video display, reducing the speed requirements of the semiconductor memory.

Other uses of the by-four organization provide for enhanced image display capabilities. For example, the by-four organization is useful in multi-color displays, since the four bits associated with each address can each constitute a memory "plane". As is well known in the art, a four plane system provides for the storage of a a binary code representative of up to sixteen colors for each corresponding pixel of the video display. Another use of the four bits is to use one of the bits to representing text, and the other three bits for representing an eight bit color code for a graphical background; the by-four memory thus facilitates the overlaying of a text message on a graphics image.

In such applications, where the image information is stored by multi-bit color codes in a bit-mapped system, often a large number of memory addresses, or pixel locations, contain the identical color code information. Such is the case where a large portion of the image is filled with a given color. In prior dual-port memory devices, such as those in the above-referenced U.S. Patents, the operation required to perform such a "fill" would be repeated write operations to the necessary number of memory locations, applying the same input data for each write cycle. In addition, the representation of data points in such a filled image often results in the same color data being stored in a multiple of memory locations in close proximity to one another.

It is therefore an object of this invention to provide a dual-port memory device having a selectable mode in which multiple memory cells having adjacent addresses may be written to in a single write cycle.

It is another object to provide such a dual-port memory with such a mode, where said multiple memory cells comprise a group within which certain ones of said multiple cells may be written, with the others in said group not altered.

It is another object of this invention to provide such a dual-port memory having such a mode, where the memory is organized in such a manner that it communicates with a plurality of parallel inputs, and where writing from selected ones of said inputs may be inhibited during the write cycle.

It is therefore yet another object of this invention to provide such a dual-port memory having such a mode, and which further contains a data register containing the data to be written to the selected memory cells during the given write cycle.

It is yet another object of this invention to provide such a dual-port memory having such a mode and containing such a data register, where the data inputs select those within the group of memory cells to which the contents of the data register are to be written.

Other objects and advantages of the instant invention will become apparent to those of ordinary skill in the art having reference to the following specification, in combination with the drawings.

SUMMARY OF THE INVENTION

The invention may be incorporated into a random access memory having a memory array organized into rows and columns, and which has a special operating mode in which a plurality of adjacent columns may be written to simultaneously. The column decoder in this memory is split into two stages, with the second (least significant) stage outputs multiplexed with another set of input signals. In normal mode, the second stage selects one of a group of columns in a write cycle; in the special mode, the other set of input signals selects one or more of the group to be written with the same input data. In this way, a selected plurality of memory cells can be written with like data. In addition, a data register is also provided for storing the data to be written to the selected ones within the group of columns. This allows the data input terminals of the memory device to receive the set of input signals which select the columns within the group to which the contents of the color register is to be written. A write mask register is also provided so that certain bits of the data register are blocked from writing to the memory array.

DETAILED DESCRIPTION OF THE PREFERRED EMBODIMENT

Figure 1:
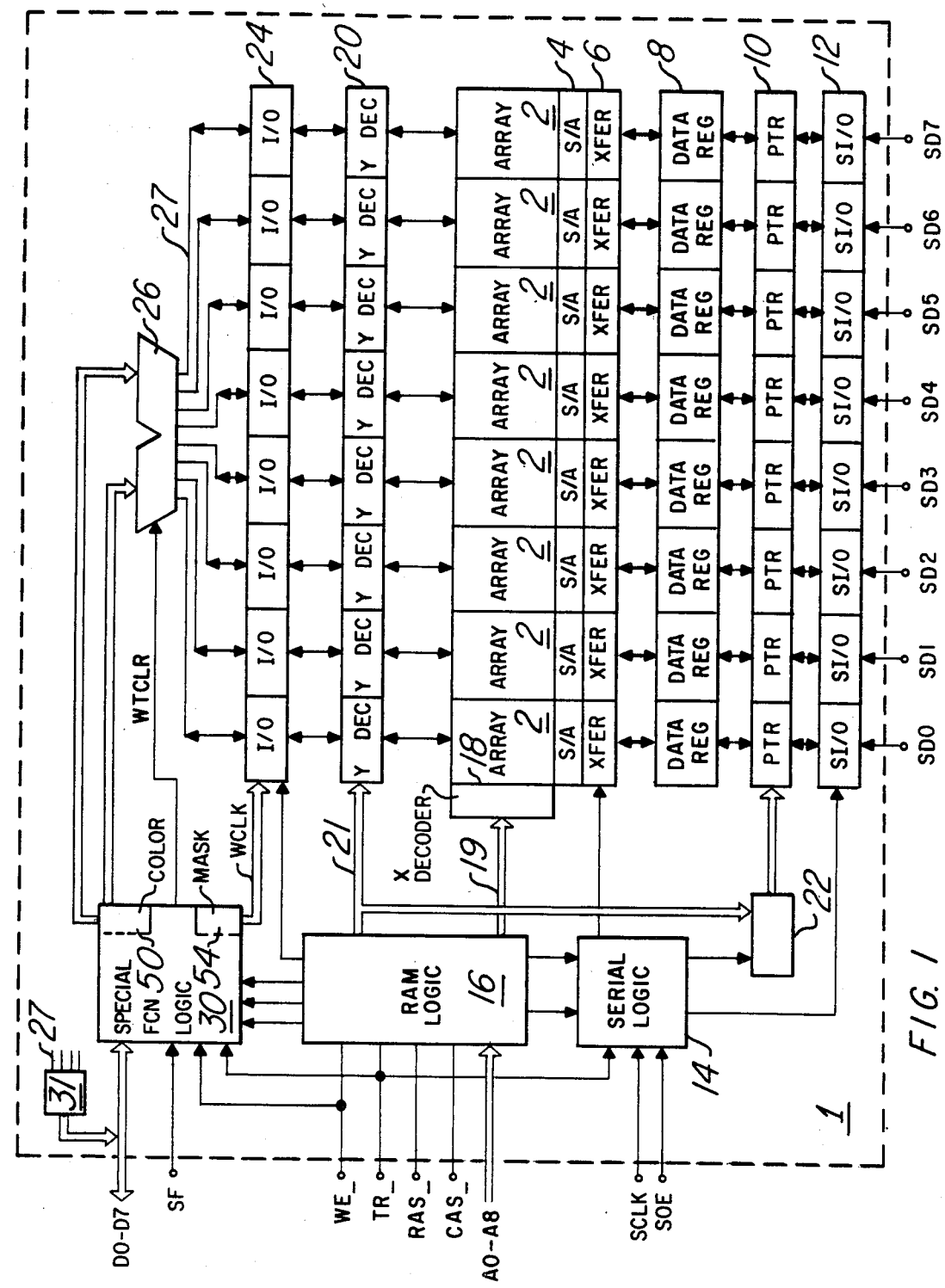
FIG. 1 illustrates a schematic block diagram of the preferred embodiment of a dual-port memory constructed according to the invention.

Referring now to FIG. 1, a functional block diagram of a dual port memory 1 constructed according to the instant invention, and containing an improved write mask feature, is illustrated. Similarly as the memory of said U.S. Pat. No. 4,636,,986, incorporated herein by this reference, dual-port memory 1 receives address signals on lines A0 through A8, clock signals RAS__, CAS__, and SCLK, write enable signal WE__, transfer enable signal TR__, and serial output enable a signal SOE. It should be noted that only a single column address strobe CAS__ is received and utilized by dual-port memory 1 as the write mask feature is included therein. Dual-port memory 1 has eight random access input/output lines D0 through D7, rather than the four such input/output terminals of the memory of said U.S. Pat. No. 4,636,986; the invention to be described herein will of course be applicable to either organization, or other organizations of a dual-port memory. Accordingly, dual-port memory 1 contains eight arrays 2, each of which in this embodiment contain 128 kbits of storage organized in 512 rows and 256 columns. Accordingly, dual-port memory 1 of FIG. 1 contains 1 Mbit storage capability. Associated with each of the arrays 2 are sense amplifier banks 4, containing 256 sense amplifiers as are well known in the art for the sensing, restoring and writing of data from and into the dynamic memory cells of the arrays 2.

Looking to the serial side of dual-port memory 1, transfer gates 6 are connected to each of the bit lines in the arrays 2, similarly as in the dual-port memory of said U.S. Pat. No. 4,636,986, for transferring data from the arrays 2 into data registers 8, or vice versa. In this example, data registers 8 are 256-bit registers, so 256 bits of data are transferred by each bank of transfer gates 6; i.e., in each transfer cycle, 2048 bits of data are transferred. Serial logic 14 receives the serial clock signal on line SCLK, a serial output enable on line SOE and the transfer signal on line TR__, as well as signals from RAM logic 16, so that the transfer of data may be effected at the proper time, as in the memory of said U.S. Pat. No. 4,636,986.

Toggle counter/decoder 22 contains a counter and a decoder for selection of a bit in each of data registers 8 or to from which serial input/output is to begin. Accordingly, toggle counter/decoder 22 receives the latched column address signal from RAM logic 16 on lines 21 which, as for the memory of said U.S. Pat. No. 4,636,986, selects the serial position from which serial input or output is to begin. Serial logic 14 controls toggle counter/decoder 22 to load the latched column address value in a transfer cycle, as above, and also provides a signal to toggle counter/decoder 22 for each cycle of the clock signal on line SCLK so that the value of the counter in toggle counter/decoder 22 is incremented for each serial cycle. Toggle counter/decoder 22 provides the decoded value stored in its counter to each of pointers 10, one such pointer 10 associated with each of the data registers 8. The contents of data registers 8 are not shifted therewithin in each serial cycle as in the memory of said U.S. Pat. No. 4,636,986, but pointer 10 instead points to a bit therewithin, with the position incrementing with each cycle of the clock signal on line SCLK incrementing the contents of the counter in toggle counter/decoder 22. The contents of the bit in each of data registers 8 which is pointed to by the associated one of pointer 10 is connected for input and output purposes to the associated one of serial input/output buffers 12, one of said serial input/output buffers being associated with each of the eight arrays 2 and data registers 8. Serial input/output buffers 12 communicate data between the associated seial input/output terminal SD0 through SD7 and the bit of its associated data register 8 which is pointed to by pointer 10. The signal on line SOE, as before, indicates to serial logic 14 whether the serial operation is a write or a read operation, and serial logic 14 controls the serial input/output buffers 12 accordingly, Serial input and output therefore occurs functionally in a fashion similar as that for the memory of said U.S. Pat. No. 4,636,986 for eight serial input/outputs, except that the serial register function is accomplished by a non-shifting data register 8 to which a bit therewithin is selected in an incrementing manner.

On the random access side, RAM logic 16 performs the address latching and decoding as performed in the memory of said U.S. Pat. No. 4,636,986, and therefore receives the row address strobe and column address strobe signals RAS_ and CAS_, respectively, and address lines A0 through A8. The row address value appearing on address lines A0 through A8 are latched by the row address strobe signal RAS_, and are communicated to X decoder 18 via lines 19, so that X decoder 18 can select a row in each of the arrays 2 responsive to the latched row address value on lines 19. Similarly, the column address value appearing on address lines A0 through A7 (the column address signal on line A8 being unnecessary to select one of 256 columns) are latched by RAM logic 16 responsive to column address strobe signal CAS_, and the latched column address value is communicated from RAM logic 16 to Y decoders 20 by way of lines 21, each of the eight arrays 2 having a Y decoder 20 associated therewith. Each of the Y decoders 20 are therefore capable to connect the desired bit line within its associated array 2 and which is corresponding to the latched column address value to its associated input/output buffer 24.

In addition to functions described in said U.S. Pat. No. 4,636,986, dual-port memory 1 has additional control over the random access data input function, such additional control performed by special function logic 30. Each of the eight input/output buffers 24 are connected to the data terminals D0 through D7 by way of multiplexer 26. For purposes of random access read, the output of input/output buffers 24 are received by output drive circuitry 31 and thereby communicated to the terminals of lines D0 through D7. Output drive cicuitry 31 is constructed in any one of a number of well known configurations, and is enabled from the external signal on line TR_ under the control of RAM logic 16. For purposes of random access write, of course, output drive circuitry 31 will be disabled by RAM logic 16 to prevent a data conflict.

During a write cycle, line WTCLR from special function logic 30 controls multiplexer 26 to select either the data value appearing at data terminals D0 through D7 or the contents of a color register 32 within special function logic 30 to input/output buffers 24 via lines 27, depending upon the function selected by the user. Special function logic 30 is also operable to control the write mask feature similar to that described above for the memory of said U.S. Pat. No. 4,636,986; special function logic 30 is operable, however, to store the value of the write mask in a write mask register 54 so that the write mask value can operate for a plurality of cycles, and so that the write mask value may be recalled many cycles after it is initially loaded, and after intervening cycles of non-masked random access writes. The contents of write mask register 54, or a non-masked write signal, as desired, are applied by special function logic 30 to input/output buffers 24 by way of lines WCLK, as will be described hereinbelow.

Figure 2:
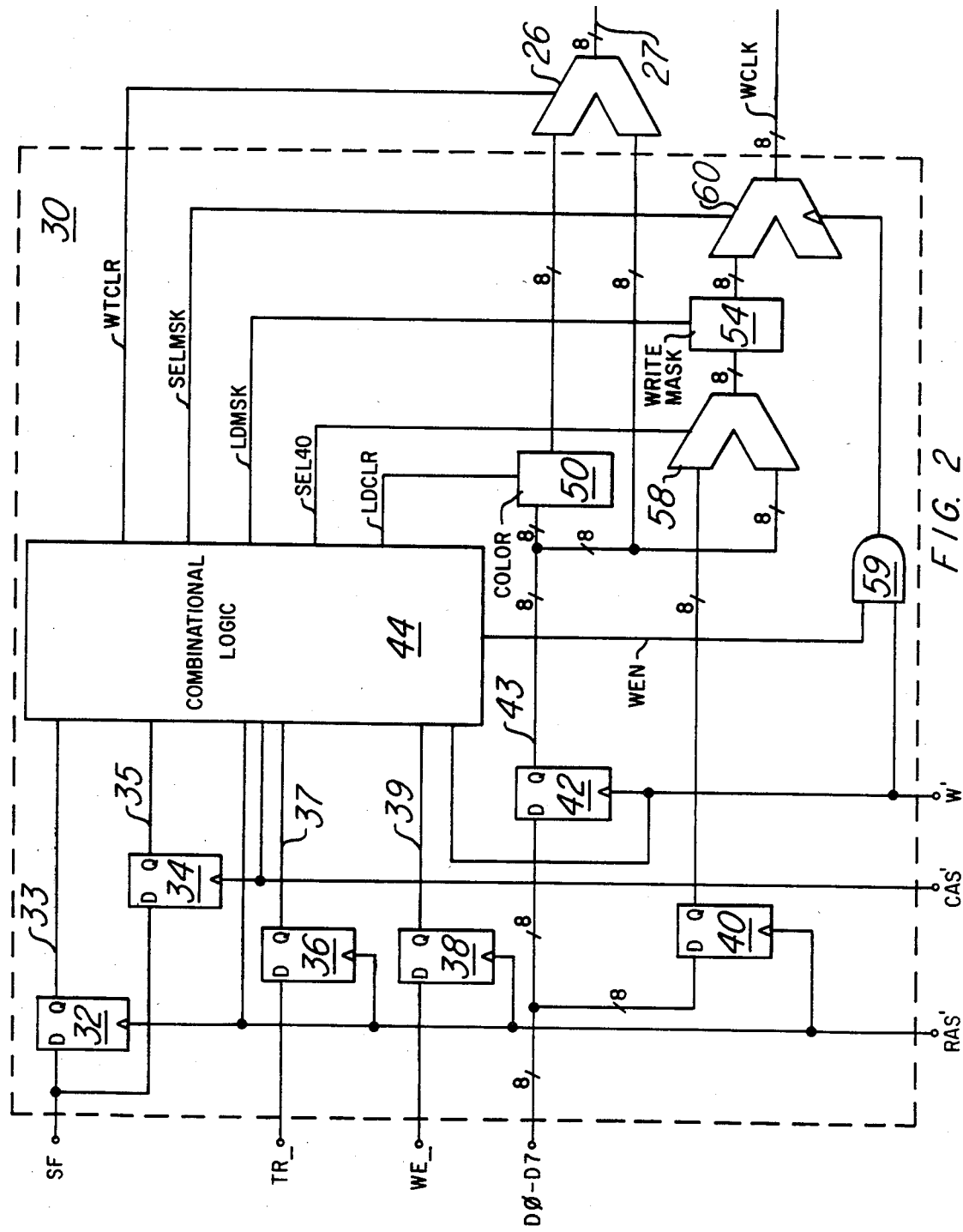
FIG. 2 illustrates a schematic block diagram of the special function logic of the dual-port memory of FIG. 1.

Referring now to FIG. 2, the construction and operation of special function logic 30 will be explained in detail. Special function logic 30 contains latches for storing the value of the various inputs thereto in conjunction with each of the row address strobe RAS_ and column address strobe CAS_ signals making high-to-low transitions, in a similar manner as the row and column addresses on address lines A0 through A8 are latched. Line SF, upon which the special function signal is presented from external to dual-port memory 1, is connected to the D-input of D-type latches 32 and 34. The clock input of latch 32 is clock signal RAS' which is delayed clock pulse generated by RAM logic 16 from row address strobe signal RAS_, and the clock input of latch 34 is clock signal CAS' which is similarly a delayed clock pulse generated by RAM logic 16 from column address strobe signal CAS_. Special function logic 30 further contains latch 36 which receives at its D input line TR_ to receives the external transfer signal, and receives at its clock input the clock signal RAS'. Latch 38 receives the external write enable signal on line WE_, and also is clocked by clock signal RAS'.

The data input signals D0 through D7 are also latched relative to row address strobe RAS_, similarly as the signals discussed above, by latch 40 within special function logic 30. Latch 40 thus consists of eight latch bits, each of which is clocked by RAS', for the storage of the eight data signals from the eight data lines D0 through D7. The output of latch 40 is connected to one input of a multiplexer 58, which has its output connected to the input of an eight bit write mask register 54, the contents of write mask register 54 corresponding to which of the eight input/output buffers 24 will be enabled for a random access write operation. The output of write mask register 54 is connected to a first input of a multiplexer 60, which has its other input connected to power supply $V_{dd}$; it is of course understood that each of the inputs to multiplexer 60 consist of eight parallel bits, with multiplexer 60 selecting between the eight bit output of write mask register 54 or an eight bit value of all "1" generated by $V_{dd}$. Multiplexer 60 is controlled by line SELMSK from combinational logic 44. Line SELMSK is set by combinational logic 44 to a high logic level when the contents of write mask register 54 are to generate the signals on the eight lines WCLKS, each of said lines WCLK associated with one of input/output buffers 24, with a high logic level on a line WCLK causing its associated input/output buffer 24 to write the value on its one of lines 27 to the selected memory location in its array 2. Line SELMSK from combinational logic 44 being at a low logic level causes mutiplexer 60 to apply power supply $V_{dd}$ to its output, signifying that all input/output buffers 24 are to perform a write operation, regardless of the contents of write mask register 54. It should be noted that multiplexer 60 is also controlled by the output of AND gate 59, which receives at its inputs clock signal W' and write enable signal WEN from combinational logic 44. The output of AND gate 59 gates the application of the selected input to multiplexer 58 to lines WCLK, so that so that the enabling signals on lines WCLK are applied to input/output buffers 24 at the proper time in the cycle, and so that no such enabling signals are applied in read cycles.

The data input signals on lines D0 through D7 are also latched into eight bit latch 42 responsive to a clock signal W', which is generated by RAM logic 16 upon the later of CAS_ and WE' going low, as discussed below. The output of latch 42 is connected to the input of an eight-bit color register 50, is connected to one input of data multiplexer 26, and is connected to the second input of multiplexer 58. The output of color register 50 is connected to the other input of data multiplexer 26. Color register 50 is loaded with the output of latch 42 upon combinational logic 44 generating a high logic level on line LDCLR, in order to store a predetermined data pattern to be presented to the eight input/output buffers 24 during a subsequent write cycle in which the color register is selected as the data source. As is evident from FIGS. 1 and 2, data multiplexer 26 is operable to select between the contents of color register 50 or the output of latch 42 for application to input/output buffers 24 via lines 27, responsive to the control signal WTCLR from combinational logic 44 in special function logic 30; a high logic level on line WTCLR causes the contents of color register 50 to be applied to lines 27. As described above, output drive circuitry 31 applies the value of lines 27 to lines D0 through D7 in read cycles.

The output of latch 42 is also presented, as described above, to a second input of multiplexer 58, to provide an alternative method for loading write mask register 54. As will be explained below in greater detail, combinational logic 44, responsive to the user selecting one of the two operation modes for loading write mask register 54, will generate a high logic signal on line LDMSK. Depending upon whether the contents of latch 40 (storing the value of lines D0 through D7 latched by RAS_) or the contents of latch 42 (storing the value of lines D0 through D7 latched by WE_) are desired, combinational logic 44 will control the application of the selected latch contents to write mask register 54 by line SEL40, which selects the output of latch 40 when high and the output of latch 42 when low.

Figure 3A:
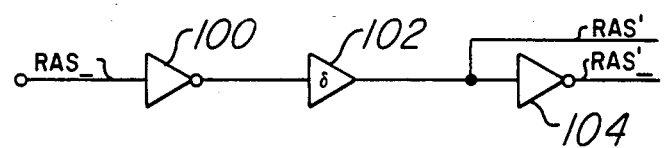
FIGS. 3a and 3b illustrate schematic diagrams of circuitry for generating clock signals used by the logic of FIG. 2.

Referring to FIG. 3a, the generation of clock signal RAS' is illustrated. The circuitry illustrated in FIG. 3a is resident within RAM logic 16 of FIG. 1. The row address strobe signal RAS_ generated externally from dual-port memory 1 is inverted by inverter 100 and, after the desired delay through delay stage 102, generates the signal RAS' referred to above. An additional inversion by inverter 104 generates clock signal RAS$_{13}$', which will be discussed below. It should be noted, of course, that the delays necessary, and indeed additional delayed versions of the signals RAS' and RAS_' are easily generated by those of ordinary skill in the art for use throughout dual-port memory 1 for a multitude of control functions. The signals CAS' and CAS_' may of course be generated within RAM logic 16 in a similar fashion, or by any of a number of methods well known by those of ordinary skill in the art.

Figure 3B:
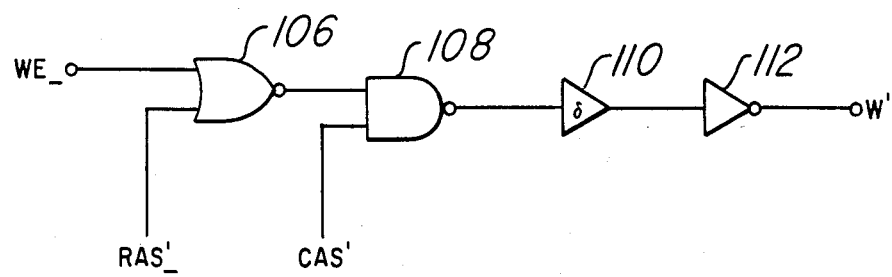

FIG. 3b illustrates the generation of the clock signal W' by RAM logic 16, such clock signal W' used in the circuit of FIG. 2. Line WE_ receives the externally generated write enable signal, which is gated by way of NOR gate 106 having its other input connected to line RAS_'. The output of NOR gate 106, which is at a high level only when the write enable signal WE_ occurs during a RAS_ active period, is connected to a first input of NAND gate 108, which has its other input connected to line CAS'. As described above, the clock signal on line CAS' is a delayed and inverted version of column address strobe signal CAS_. The output of NAND gate 108 is at a low logic level upon both the output of NOR gate 106 and signal CAS' being at a high logic level; i.e., upon the later to occur of WE_ and CAS_. By way of the desired delay by delay stage 110 and inversion by inverter 112, the clock signal W' utilized by the circuit of FIG. 2 is generated.

As generally discussed above, combinational logic 44 generates various control signals responsive to the stored state of latches 32, 34, 36 and 38, as presented on lines 33, 35, 37 and 39, respectively. These control signals control dual-port memory 1 to execute the operations of its various modes. Table 1 is a truth table for the various special modes of dual-port memory 1, certain of which will be further explained in detail hereinbelow.

TABLE 1

| RAS_ transition | | | CAS_ transition | |
|---|---|---|---|---|
| TR_ | WE_ | SF | SF | Function |
| 0 | 0 | 0 | X | Register-memory xfer |
| 0 | 1 | 0 | X | Memory-register xfer |
| 1 | 0 | 0 | 0 | Load write mask on RAS_; write data to array |
| 1 | 0 | 0 | 1 | Load write mask on RAS_; write color register to array |
| 1 | 0 | 1 | 0 | Use old write mask; write data to array |
| 1 | 0 | 1 | 1 | Use old write mask; write color register to array |
| 1 | 1 | 1 | 0 | Load write mask on WE_ |
| 1 | 1 | 1 | 1 | Load color reg. on WE_ |
| 1 | 1 | 0 | 1 | Disable write mask; write color register to array |
| 1 | 1 | 0 | 0 | Disable write mask; normal read/write |

As discussed above, control signal WTCLR is the signal generated by combinational logic 44 to cause data multiplexer 26 to select between the contents of color register 50 and the output of latch 42 for application to the input/output buffers 24. Control signal LDCLR is a signal generated by combinational logic 44 to cause color register 50 to be loaded with the contents of latch 42. Control signal LDMSK is a signal generated by combinational logic 44 to write mask register 54, to cause write mask register 54 to be loaded with either the contents of latch 42 or the contents of latch 40, depending upon the state of SEL40 which controls the operation of multiplexer 58. The application of the contents of write mask register 54 to lines WCLK is enabled depending upon the logic state on line SELMSK from combinational logic 44. Accordingly, combinational logic 44 is constructed of such logic necessary to generate the appropriate control signals responsive to the inputs presented thereto, and as will be described with reference to FIG. 4.

Combinational logic 44 receives the outputs of latches 32, 34, 36, and 38 on lines 33, 35, 37, and 39, respectively, as well as clock signals RAS' and W' described above. The construction and operation of combinational logic 44 will be described herein as it enables each of the special functions referred to above in Table 1.

As described above, write mask register 54 may be loaded from either the contents of latch 40 or the contents of latch 42. Since latch 42 is loaded responsive to the clock signal W', occurring upon the later of CAS_ and WE_, not only can write mask register 54 be loaded in different ways, but write mask register 54 can also be loaded at different times in a cycle, allowing increased flexibility for the user of dual-port memory 1.

Figure 5A:
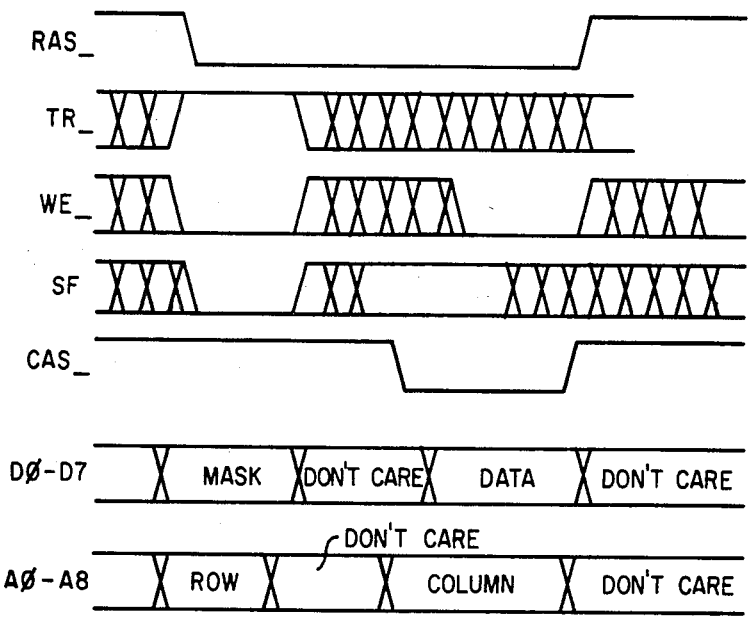
FIG. 5a illustrates a timing diagram of a memory cycle for loading the write mask register during the early portion thereof.

Referring to FIG. 5a, a timing diagram for the loading of write mask register from latch 40, i.e., during the first portion of the cycle, is illustrated. Table 1 indicates that write mask register 54 is loaded early when lines WE__ and SF are at a low logic level, and line TR__ at a high logic level, at the time that RAS__ makes its high-to-low transition, as shown in FIG. 5a. At this time, the value on data lines D0 through D7 is loaded into latch 40 (responsive to clock signal RAS'), and the values on lines SF, TR__, and WE__ are latched into latches 32, 36 and 38, respectively. The outputs of latches 32, 36 and 38 on lines 33, 37 and 39, respectively, are connected to the inputs of NAND gate 118 (lines 33 and 39 inverted by inverters 114 and 116). Accordingly, the output of NAND gate 118 will go to a low level upon the latched states of lines WE__ and SF at a low level and the latched state of TR__ being at a high level. This presents a logic low to one input of NOR gate 120, which has its other input controlled by clock signal RAS', delayed as desired by inverting delay stage 122 to allow the operation of the latches and logic to occur; upon the low-to-high transition of delayed clock signal RAS', the output of NOR gate 120 will go to a high level, generating a high level on line SEL40 to multiplexer 58 of FIG. 2, indicating that the output of latch 40 is to be selected. Line SEL40 is also connected to one input of OR gate 124, to generate a high level on line LDMSK. Line LDMSK is connected to write mask register 54, and upon making a low-to-high transition indicates that write mask register 54 is to be loaded with the value of the output of multiplexer 58 which, in the described case, is the contents of latch 40. By this operation, write mask register 54 is loaded during the first part of the memory cycle.

After the values of lines TR__, WE__ and SF are latched into their respective latches upon RAS__ going low, lines TR__, WE__ and SF are "don't cares" for purposes of the loading of write mask register 54 and can go to another logic level. Subsequent to the loading of write mask register 54, however, either a read or a write cycle may be performed by dual-port memory 1 depending upon the values placed on lines WE__ and TR__ (line TR__, as in memory of said U.S. Pat. No. 4,636,986, serving as a random access output enable). FIG. 5a illustrates the more likely event of a write cycle occurring after the loading of write mask register 54 (the user's interest in performing a write operation is evidenced by the loading of write mask register 54). As shown in FIG. 5a, the row address value, i.e., the state of address lines A0 through A8 at the time of the RAS__ transition, is received during the time that write mask register 54 is being loaded; the row address decoding and selection occurs by way of RAM logic 16 and X decoder 18 in the well known RAM manner. The column address value is presented on lines A0 through A7 in conjunction with the column address strobe signal CAS__, as illustrated in FIG. 5a.

Table 1 indicates that the value of line SF at the time of the CAS__ transition determines whether the data received on lines D0 through D7 or the contents of color register 50 will be the data written to arrays 2. As shown in FIG. 2, latch 34 is loaded with the value of line SF responsive to clock signal CAS', which is delayed and inverted signal relative to CAS__. Line 35 from the output of latch 34 is connected (after inversion by inverter 125) to one input of NOR gate 126. AND gate 127 receives at one of its inputs the output of NAND gate 118, which is at a low level as described above in the loading of write mask register 54; this of course forces a low logic level at the output of AND gate 127, which is presented to the other input of NOR gate 126. A high level will be generated at the output of NOR gate 126, and on line WTCLR, if the value of line SF at the time of the CAS__ transition is at a "1" logic level, and a low level on line WTCLR will be generated in the event that line SF is at a "0" level at the CAS__ transition. Line WTCLR is connected to the control input of data multiplexer 26 which applies the contents of color register 50 to lines 27 responsive to line WTCLR at a high logic level, and applies the contents of latch 42 to lines 27 when line WTCLR is at a low level. In this manner, combinational logic 44 is operable to select the data source for a write operation in the same memory cycle as a write mask register 54 load, said selection responsive to the value of line SF at the CAS__ transition.

Lines 33, 37 and 39 are also connected to the inputs of AND gate 128, line 33 being inverted by inverter 114 prior thereto. Accordingly, since the value of the WE__ line was at a logic "0" at the time of the RAS__ transition, the output of AND gate 128 is at a logic "0". The output of AND gate 128 is connected, through inverter 130, to line SELMSK which is connected to the control input of multiplexer 60. A high logic level on line SELMSK, as in this cycle where write mask register 54 is loaded responsive to the RAS__ transition, indicates that the contents of write mask register 54 are to be selected for generation of the signals on lines WCLK to input/output buffers 24. In addition, lines 33, 37 and 39 are also connected, with none inverted, to the inputs of AND gate 132; the output of AND gate 132 will also be at a logic low level, due to lines 33 and 39 being at logic low levels. The output of AND gate 132 is connected to inverter 134, which generates at its output the signal for line WEN connected to one input of AND gate 59 in FIG. 2. Accordingly, since the output of AND gate 132 is at a low level, line WEN is at a logic high level, enablig clock signal W' to gate, via multiplexer 60, the contents of write mask register 54 to lines WCLK. As described above, the signals on lines WCLK are the write clocks to input/output buffers 24, which will effect the writing of the data on lines 27 to arrays 2, with those input/output buffers associated with stored "0"s in write mask register 54 not performing a write operation. Therefore, upon the later of WE__ and CAS__ making a high-to-low transition while the other is active low (i.e., the transition of WE__ to a low level and back to a high level in conjunction with RAS__ transition does not generate the W' clock signal), a clock signal will be generated on line W', which will appear to gate the selected input of multiplexer 60 to lines WCLK to effect the write operation by input/output buffers 24.

Figure 6:
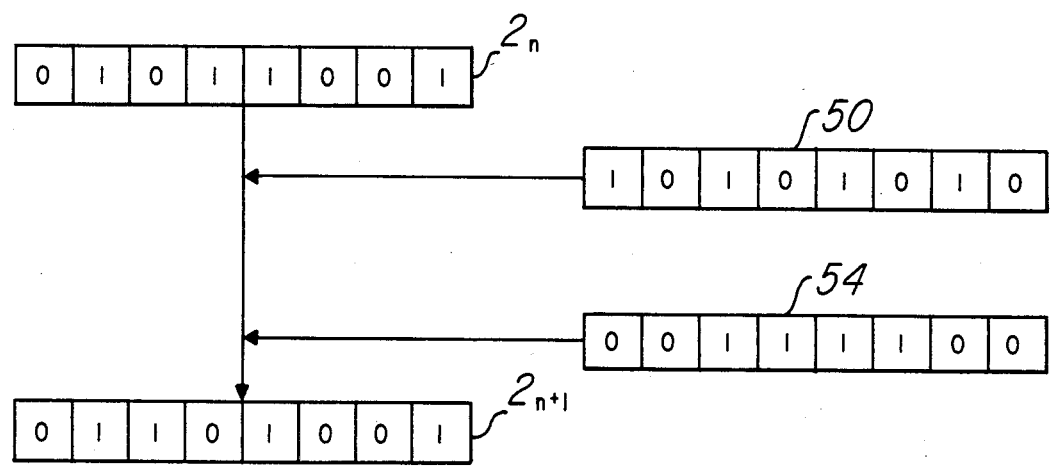
FIG. 6 is a register level illustration of a masked write operation.

FIG. 6 illustrates the masked write operation on a register-level diagram. An example of the eight bits of a memory location prior to the masked write operation is shown therein as $2_n$, with each of the eight bits corresponding to the addressed location within each of arrays 2 of dual-port memory 1. The data source containing the data to be written in this example is color register 50, an example of the contents of which illustrated in FIG. 6 as $10101010_2$. The contents of write mask register 54 are illustrated in FIG. 6 as writing only to the four center bits, i.e., the third through sixth least significant bits of the eight bit memory location; conversely, the write operation is "masked" relative to the two most and two least significant bits of memory location $2_n$. Upon performing the write cycle described above, where the contents of color register 50 is written in a masked write, the updated contents of the addressed memory location is shown in FIG. 6 as $2_n+1$. It should be apparent that only the center four bits are written with the contents of color register 50, with the two most and two least significant bits remaining the same prior to the write operation.

Figure 5B:
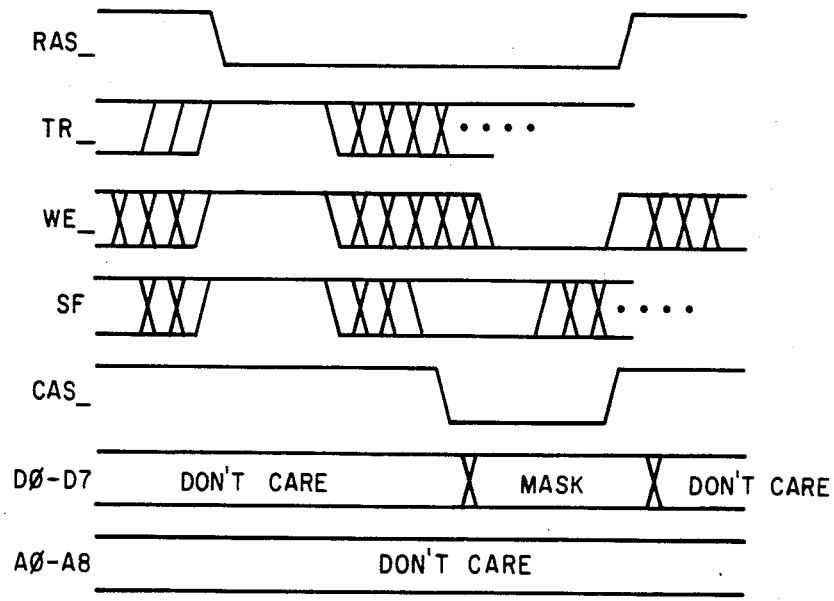
FIG. 5b illustrates a timing diagram of a memory cycle for loading either the write mask register or the color register during a latter portion thereof.

As mentioned above, dual-port memory 1 can load write mask register 54 during the latter portion of the memory cycle, by way of latch 42 clocked by clock signal W'. FIG. 5b illustrates a timing cycle for the loading of write mask register in the latter portion of the memory cycle. Lines 33, 37 and 39 are, as discussed above, connected to the inputs of AND gate 132 without any of the three signals being inverted, so that the output of AND gate 132 is at a high level when all three are at a high level. This corresponds to Table 1, where the late loading of write mask register 54 is enabled by lines SF, WE_ and TR_ being at a high logic level at the RAS_ transition. The high level at the output of AND gate 132 presents, via inverter 134, a low level on line WEN which disables any write clock signals from being presented on lines WCLK, thereby preventing a write operation to arrays 2. The output of AND gate 132 is connected to one input of NAND gate 136, which has line W' connected to its other input; until the later of WE_ or CAS_ (after the RAS_ transition), the output of NAND gate 136 will remain at a high logic level. NOR gate 138 receives the output of NAND gate 136 at one input, and receives the output of latch 34 on line 35 at its other input; as stated above, latch 34 stores the value of line SF at the time of the CAS_ transition. Table 1 indicates that write mask register 54 is loaded when line SF is at a "0" level at the CAS_ transition, when lines SF, WE_ and TR_ are all high at the RAS_ transition. Accordingly, for load of write mask register 54, line 35 wil be at a low level responsive to clock signal CAS' latching the low level on line SF into latch 34.

The loading of write mask register 54 is completed upon the later of WE_ or CAS_ (after the RAS_ transition_). The example illustrated in FIG. 5b shows WE_ making its transition after CAS_, and the following description will use this example. Referring back to FIG. 2, latch 42 will be loaded with the value on lines D0 through D7 upon clock signal W', which is generated upon the later of $WE_{13}$ and CAS_ making a high-to-low transition (while the other is active; see FIG. 3b). FIG. 5b illustrates the presentation of the contents of write mask register 54 as "MASK" on data lines D0 through D7 at the time of WE_ going low. In addition, clock signal W' causes the output of NAND gate 136 to go to a low level, thereby generating a high level at the output of NOR gate 138. This generates, via OR gate 124, a high level on line LDMSK which causes a load of write mask register 54 with the output of multiplexer 60. Since the output of NAND gate 118 is at a "1" level (line 39 being at a high level), line SEL40 will be at a low level by operation of NOR gate 120. As described above, a low level on line SEL40 will control multiplexer 60 to select the contents of latch 42 for application to write mask register 54 upon the LDMSK signal generated above; latch 42 is storing the value of data lines D0 through D7 loaded thereinto at this time. In this manner, combinational logic 44 effects the late load of write mask register 54 by way of the timing of FIG. 5b, with line SF at a low level at the CAS_ transition.

Color register 50 is loaded in the same manner as write mask register 54 in the late-load mode, only with line SF at a high level at the CAS_ transition as indicated in Table 1. This is effected by NOR gate 140 which receives the output of NAND gate 136 discussed above, and which receives line 35 after inversion by inverter 125. A high logic level on line SF at the CAS_ transition results in a low level at one input of NOR gate 140. Upon the later of WE_ and CAS_ making a high-to-low transition, the output of NAND gate 136 goes to a low level as described above, driving the output of NOR gate 140 to a high level. The output of NOR gate 140 is line LDCLR which is connected to color register 50 and which, at a high level, causes color register 50 to be loaded with the contents of latch 42. Latch 42, as described above, is loaded with the value of data lines D0 through D7 responsive to clock signal W' (i.e., the value "CONTENTS" of FIG. 5b).

It should be noted that for either the loading of color register 50 or of the late loading of write mask register 54 random access of dual-port memory 1 is inhibited. As illustrated in FIG. 5b, this causes the values of the addresses on lines A0 through A8 to be "don't cares" at both the RAS_ and CAS_ transitions.

It is useful, as discussed above in the "Background of the Invention", to be able to use the contents of write mask register 54 in a multiple of memory cycles, as well as to be able to perform unmasked write operations without requiring the reloading of the write mask information prior to performing a subsequent masked write operation. Accordingly, Table 1 indicates that certain modes of operation are available to repeatedly use the contents of write mask register, as well as to perform unmasked write operations while retaining the write mask information in write mask register 54. Special function logic 30, and combinational logic 44 therewithin, are designed to accomplish these functions.

Figure 4:
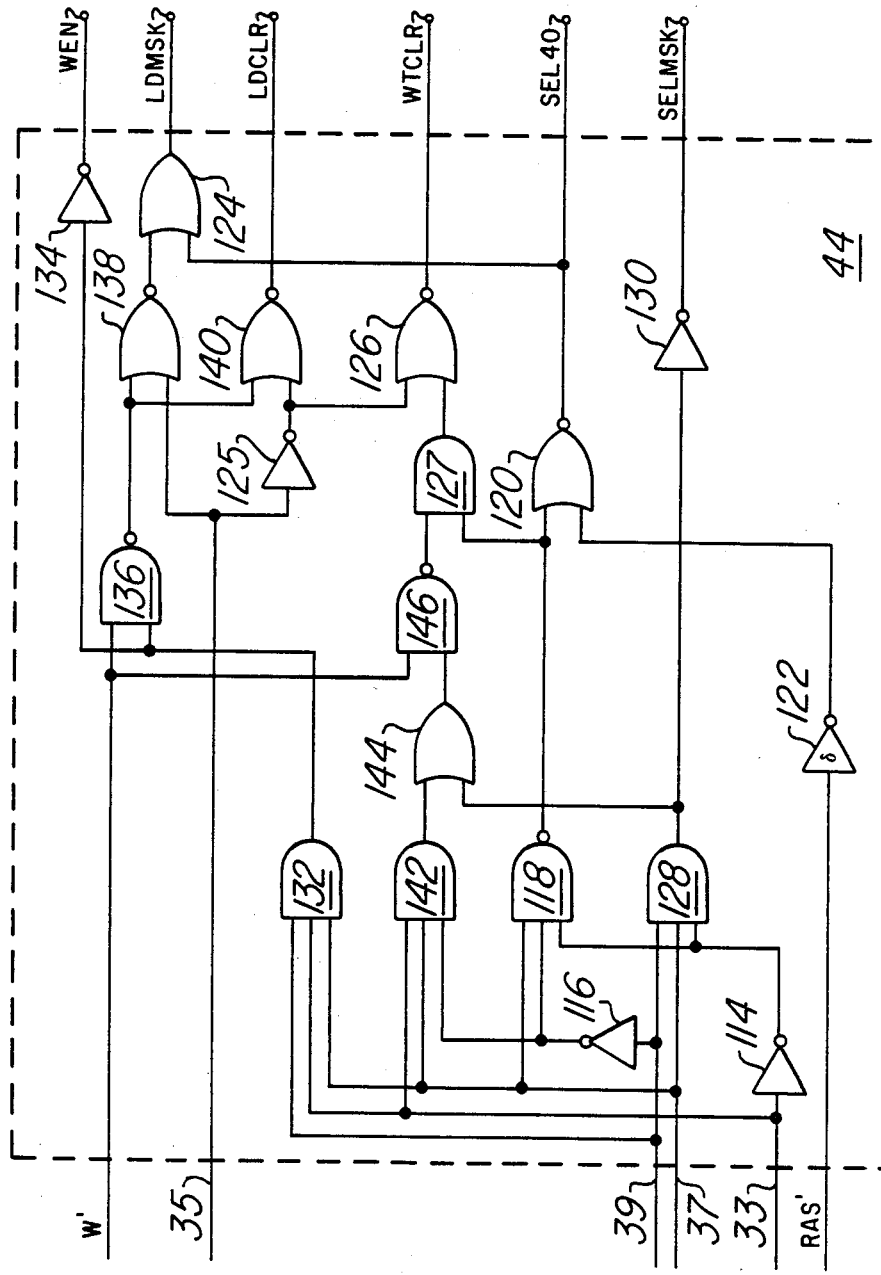
FIG. 4 illustrates a schematic diagram of combinational logic within the special function logic of FIG. 2.
Figure 5C:
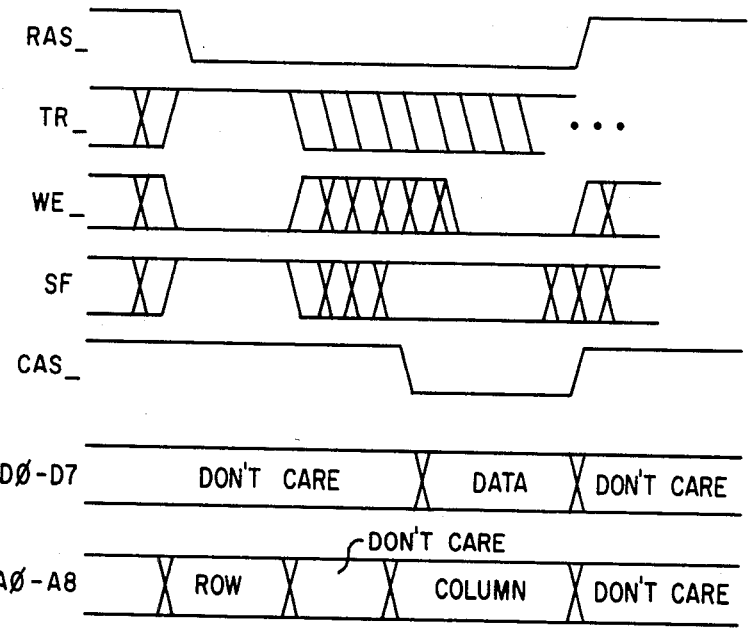
FIG. 5c illustrates a timing diagram of a memory write cycle utilizing the contents of the write mask register loaded in a previous cycle.

FIG. 5c is a timing diagram illustrating the operation of a masked write cycle, without the reloading of write mask information, i.e., utilizing the prior contents of write mask register 54. Upon the RAS_ transition, lines TR_ and SF are at a high logic level, while line WE_ is at a low logic level. As before, latches 32, 36, and 38 latch in these values upon clock signal RAS', for receipt by combinational logic 44. Referring to FIGS. 2 and 4, since the output of AND gate 128 is at a logic low level for this combination, line SELMSK will be at a high level, so that the contents of write mask register 54 will be selected for application to lines WCLK upon the output of AND gate 59 going to a high level. Since this combination of lines TR_, SF and WE_ on the RAS_ transition causes the output of AND gate 132 to be at a low level, so that line WEN will be at a high level, which allows the later of WE_ and CAS_ going low to apply the output of multiplexer 60, i.e., the contents of write mask register 54, to lines WCLK.

For the above-described combination of lines TR_, SF and WE_ on the RAS_ transition, however, the contents of write mask register 54 applied in this cycle will be unchanged from its prior state. The reloading of write mask register 54 is precluded by combinational logic 44, since the low level output of AND gate 132 also causes the output of NAND gate 136 to be at a high level and, in turn, the output of NOR gate 138 to be at a low level. Since the output of NAND gate 118 is at a high level for the above combination of lines TR—, SF and WE— on the RAS— transition shown in FIG. 5c, a low level is forced at the output of NOR gate 120. Therefore, both inputs to OR gate 124 are low, which forces a low level on line LDMSK, precluding write mask register 54 from being reloaded. The pripr contents of write mask register 54 are thereby retained, and are utilized in the write cycle as selected by line SELMSK described above.

Depending upon the state of line SF upon the CAS— transition, the data applied to lines 27 for the masked write operation of can either be the contents of color register 50, or the value of data lines D0 through D7 latched by latch 42 upon clock signal W'. Combination logic 44 illustrated in FIG. 4 allows this selection according to the truth table of Table 1, by way of AND gate 142 having its three inputs connected to lines 33, 37 and 39, with line 39 inverted by inverter 116. The output of AND gate 142 thus will have its output at a high logic level responsive to the combination upon the RAS— transistion of lines TR— and SF at a high logic level and while line WE— at a low logic level. The output of AND gate 142 is connected to a first input of OR gate 144, driving the output of OR gate 144 high when it is at a high level. The output of OR gate 144 is connected to a first input of NAND gate 146, which has its other input connected to clock signal W' described above, and its output connected to an input of AND gate 127. NAND gate 146 therefore has its output driven low when the output of AND gate 142 is at a high level upon the low-to-high transition of clock signal W'. The low level of the output of NAND gate 146 forces a low level at the output of AND gate 127 which presents a low level at an input of NOR gate 126 as discussed above. Similarly as discussed above for the cycle of FIG. 5a, line WTCLR is driven high or low by operation of line 35 from latch 34, which stores the value of line SF upon the CAS— transition, thereby controlling data multiplexer 26 to select the contents of color register 50 for application to lines 27 to input/output buffers 24, or to select the value of data lines D0 through D7. FIG. 5c illustrates the timing required for data lines D0 through D7 to present valid data ("DATA") in the event that such input data is the desired data source. As described above, latch 42 latches the input data upon clock signal W', with the output of latch 42 applied to one input of data multiplexer 26, if desired by the user.

Figure 5D:
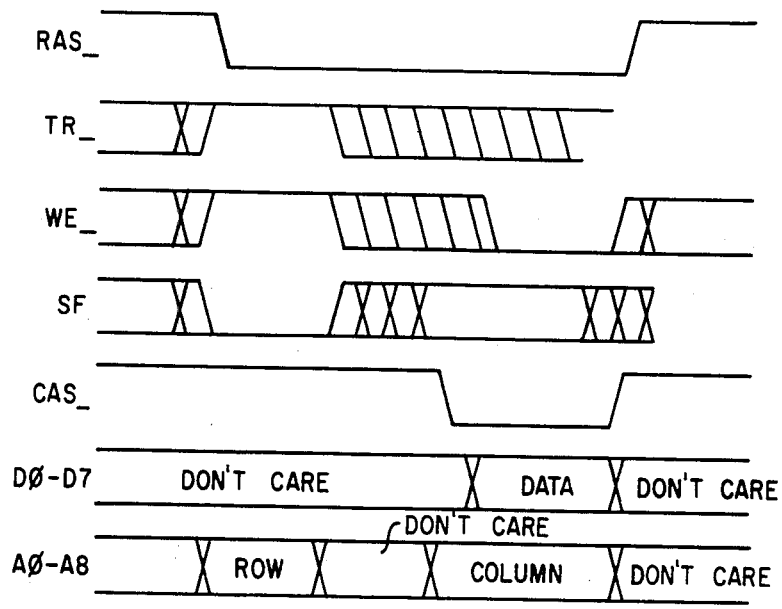
FIG. 5d illustrates a timing diagram of a memory write cycle ignoring the contents of the write mask register without destroying its contents.

The contents of write mask register 54 may be ignored for a write operation, yet retained for subsequent masked write operations, by a special cycle effected by special function logic 30, and combinational logic 44 therewithin. The timing of an example of such a cycle is illustrated in FIG. 5d. Upon the RAS— transition, as stated in Table 1, lines TR— and WE— are at a high logic level while line SF is at a low level: as before, these values are latched into latches 36, 38 and 32, respectively, by clock signal RAS'. This combination, presented on lines 27, 39 and 33 (line 33 inverted by inverter 114) causes the output of AND gate 128 to go to a "1" logic level, placing a low logic level on line SELMSK so as to cause multiplexer 60 to select $V_{dd}$ for application to lines WCLK at the proper time, ignoring the contents of write mask register 54. Since the contents of latch 32, corresponding to the state of line SF low on the RAS— transition, is at a low level, the output of AND gate 132 is also low, placing a high level on line WEN so that clock signal W' will be passed through to multiplexer 60 for generation of the high logic levels on all of lines WCLK, due to line SELMSK being low. As for the prior write cycles, FIG. 5d illustrates that line WE— is driven low after the CAS— transition, to effect the write operation via write signal W'.

Similarly as in the case of FIG. 5b, loading of write mask register 54 is precluded, since the outputs of AND gate 132 is low and the output of NAND gate 118 is high for the combination of lines TR— and WE— high with line SF low upon the RAS— transition. Since no new value is loaded into write mask register 54 (line LDMSK staying low), the prior value stored therein is retained. Accordingly, a subsequent cycle such as that illustrated in FIG. 5c will cause a masked write operation, using the write mask information retained in write mask register 54, without the need to reload the write mask information.

As discussed above relative to FIG. 5c, the state of line SF at the time of the CAS— transition will control whether the write cycle of FIG. 5d uses color register 50 as the data source (line SF being a "1") or uses the value of data lines D0 through D7 ("data" of FIG. 5d) as the data source. Combinational logic 44 effects this selection since the output of AND gate 128 is connected to a second input of OR gate 144, thereby having the same effect on the generation of the WTCLR signal by NOR gate 126 as the output of AND gate 142 discussed above relative to the cycle of FIG. 5c.

In the use of a dual-port memory such as dual-port memory 1 shown in FIG. 1 in a video system, often a number of successive memory locations may be written with identical data. For example, where dual-port memory 1 contains a bit-mapped representation of a graphics image, a large area of the displayed image may be filled with a certain color. Accordingly, it would be useful to write identical data to multiple locations in dual-port memory in single cycles.

Figure 7:
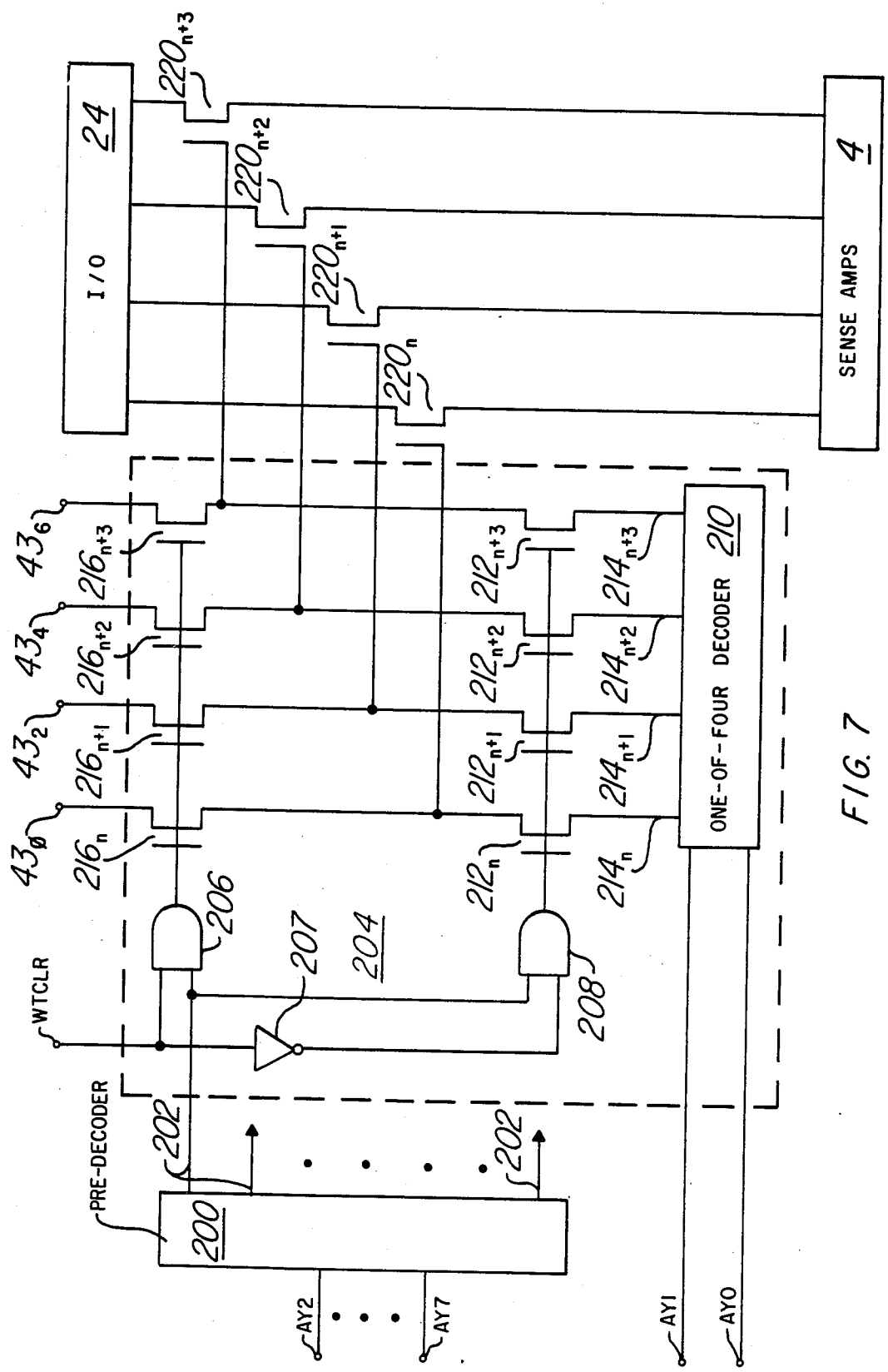
FIG. 7 is a schematic diagram of a column decoder which incorporates the addition of a block write feature to the memory of FIG. 1.

Referring now to FIG. 7, a block diagram of Y decoder 20 is illustrated which contains circuitry for performing the feature of addressing adjacnet columns therewithin in a single cycle, hereinafter referred to as the "block write" feature. While the operation of dual-port memory 1 may be enhanced by the feature described hereinbelow relative to FIG. 7, it should be noted that dual-port memory described hereinabove is fully operable without the block write feature. It should be noted that FIG. 7 illustrates Y decoder 20 for a single array 2 in dual-port memory 1; of course, the circuitry illustrated in FIG. 7 will of course by associated with each of arrays 2 shown in FIG. 1. Y decoder 20, as described above, receives the latched values of the column address received on address lines A0 through A7; these latched column address lines are represented by lines AY0 through AY7 on FIG. 7. Of course, since only 256 columns are present in each of arrays 2, the value of address line A8 latched by the CAS— signal is not utilized in the column decoding operation. Predecoder 200 receives lines AY2 through AY7, and decodes these six bits into 64 output lines 202, one of which will be enabled by being at a high logic level. Each of output lines 202 thus represents the selection of a group of four columns in its associated array 2.

Associated with each group of four columns is column select circuit 204; only one column select circuit 204 is illustrated in FIG. 7, for the sake of simplicity. The associated output line 202 from pre-decoder 200 is connected to one input of AND gate 206, and to one input of AND gate 208, contained within each column select circuit 204. Line WTCLR from special function logic 30 is connected to the second input of AND 206; line WTCLR, inverted by inverter 207, is connected to the second input of AND gate 208. As described above, line WTCLR is generated when the contents of color register 50 are to be written into arrays 2; the feature described herein for addressing multiple columns within each of arrays 2 is enabled by the same signal. Also included within column select circuit 204 is one-of four decoder 210 which performs the actual decoding of the least significant column address bits on lines AY0 and AY1, in selecting the column within array 2 which is to be addressed in the random access mode. One-of-four decoder 210 drives four lines $214_n$ through $214_{n+3}$, depending upon the value of lines AY0 and AY1. Pass transistors $212_n$ through $212_{n+3}$ connect its corresponding line $214_n$ through $214_{n+3}$ to the gate of its corresponding transistor $220_n$ through $220_{n+3}$. The gates of each of pass transistors $212_n$ through $212_{n+3}$ are controlled by the output of AND gate 208. Accordingly, in the event that the block write feature is selected, i.e., line WTCLR is at a high logic level, the result of one-of-four decoder 210 will be ignored, even if the corresponding output line 202 is selecting the group of four columns associated therewith.

Column select circuit 204 further receives the even bits of the contents of latch 42, shown in FIG. 7 as lines $43_0$, $43_2$, $43_4$ and $43_6$. As described above, latch 42 stores the value of data input lines D0 through D7 received at the time of the later of the write enable signal on line WE— or the column address signal on line CAS— in each cycle. Each of lines $43_0$, $43_2$, $43_4$ and $43_6$ are connected to a pass transistor $216_n$ through $216_{n+3}$, which has its gate connected to the output of AND gate 206, and each of which is also connected to the gate of its corresponding transistor $220_n$ through $220_{n+3}$.

Transistors $220_n$ through $220_{n+3}$ connect the input-/output buffer 24 associated with array 2 to the sense amplifer 4 associated with its column, in order to accomplish the write operation for the selected columns, in a manner well known in the art. For the normal operating mode where line WTCLR is not enabled, the output of AND gate 206 is at a logic low, disabling lines $43_0$, $43_2$, $43_4$ and $43_6$ from affecting the state of transistors $220_n$ through $220_{n+3}$. At the same time, the output of AND gate 208 for the group of four columns selected by pre-decoder 200 will be at a logic level, allowing the result of one-of-four decoder 204 to control the connection of the associated input/output buffer 24 to the sense amplifier 4 for the selected column.

When the block write feature is selected by the state of lines WE—, SF and TR— as shown in Table 1 for the enabling of line WTCLR by combinational logic 44, the output of AND gate 206 will be at a high level for the group of four columns which are selected by pre-decoder 200 responsive to lines AY2 through AY7. In this event, the state of lines $43_0$, $43_2$, $43_4$ and $43_6$ will determine which of transistors $220_n$ through $220_{n+3}$ will be conductive, and indeed allows the connection of up to all four of the columns in the associated group to be connected to its input/output buffer 24. The contents of the bit of color register 50 corresponding to the array 2 will then be written into the columns selected by the state of lines $43_0$, $43_2$, $43_4$ and $43_6$, from latch 42.

Figure 8:
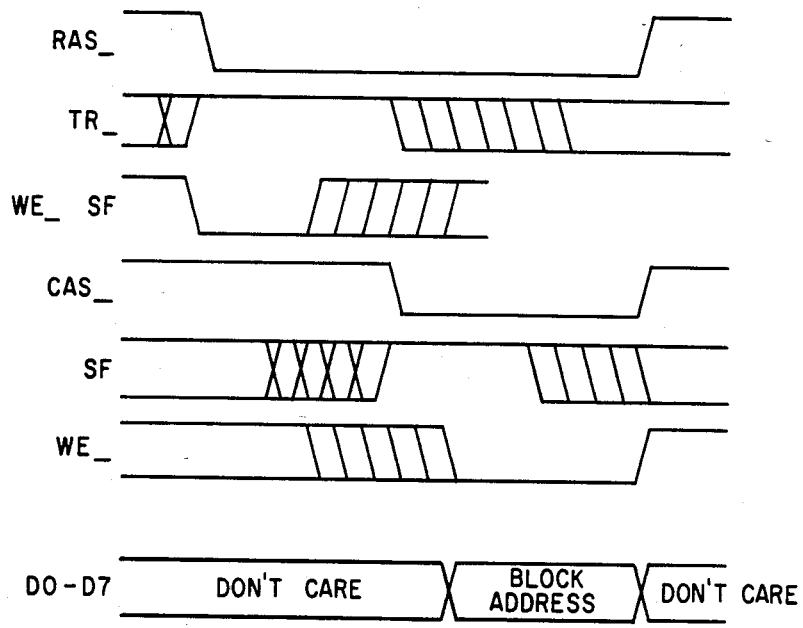
FIG. 8 is a timing diagram of the operation of a block write cycle, using the circuitry of FIG. 7.

Referring now to FIG. 8, a timing diagram is illustrated which illustrates the operation of the block write feature. As is evident from Table 1 above, the contents of color register 50 are written in write cycles when line TR— is high at RAS— going active with either line WE— or line SF low at that time, in conjunction with line SF being high when column address signal CAS— goes active. According to Table 1 and as illustrated in FIG. 8, the write operation of the color register (and, in this embodiment, the block write feature), requires at the time that row strobe signal RAS— goes active in its low state, that line TR— is high, and that the logical AND of WE— and SF is low; at the time that column address strobe signal CAS— goes active, line SF must be in its high state. With the block write mode thus enabled, the value of the even bits of the data input signal on lines D0 through D7 (i.e., lines D0, D2, D4 and D6) at the time of the later of CAS— or WE— going active designates the columns in the group of four which are to be written with the value of the color register 50 for the corresponding array 2. As explained above, all four of such columns may be addressable in this mode, providing the feature that four columns in each of the eight arrays 2 may be written in a single cycle.

Figure 9:
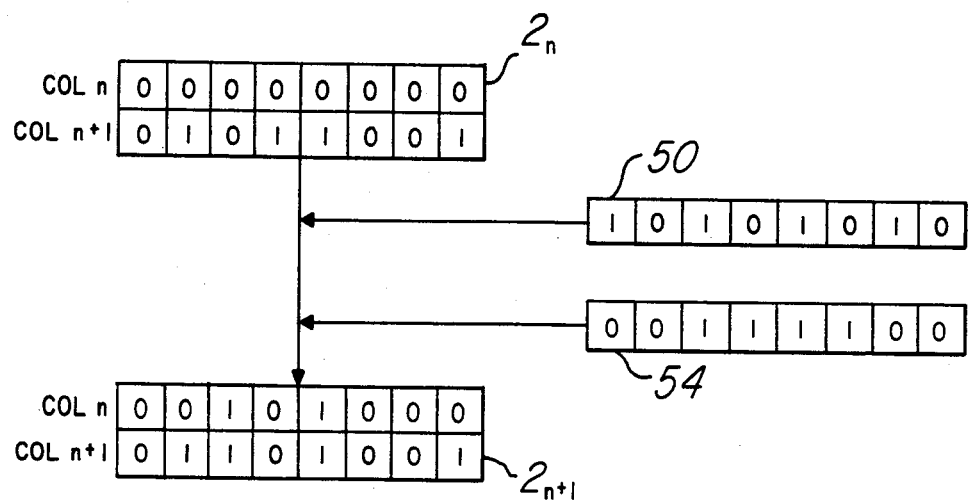
FIG. 9 is a register level illustration of a block write cycle, using the circuitry of FIG. 7.

Referring again to Table 1, i the event that both line SF and line WE— are low at the time RAS— goes active, the masked write operation will be enabled along with the block write feature. In this way, the contents of color register 50 may be written to multiple columns (within a group of four), to only selected arrays. Referring to FIG. 9, a register level illustration of the application of the color register 50 and write mask register 54 is illustrated in modifying the contents of the memory locations in each of the arrays 2 associated with two columns $COL_n$ and $COL_{n+1}$. As described above, columns n and n+1 would be selected in the event that data lines D0 and D2 had a "1" logic level, and data lines D4 and D6 had a "0" logic level, at the time of write enable line WE— going active after CAS— is active in the timing of FIG. 8. As in the example of FIG. 6, only third through sixth least significant bits are written to with the contents of color register 50; with the block write feature explained above, however, this masked write operation takes place simultaneously in selected columns $COL_n$ and $COL_{n+1}$.

While the invention has been described in detail herein with reference to its preferred embodiment, it is to be understood that this description is by way of example only, and is not to be construed in a limiting sense. It is to be further understood that numerous changes in the details of the embodiment of the invention, and additional embodiments of the invention, will be apparent to, and may be made by, persons of ordinary skill in the art having reference to this specification. It is contemplated that such changes and additional embodiments are within the scope and true scope of the invention as claimed below.

We claim:

1. A memory device having a normal write mode and a block write mode, comprising:
   an array of read/write memory cells;
   mode select means, for receiving a mode select signal indicating said normal write mode or said block write mode;
   an address decoder, for decoding a memory address signal, comprising:
   a first decode stage for decoding selected bits in said memory address signal, said selected bits specifying a group of memory cells in said array;
   a second decode stage associated with each of said groups of memory cells, said second decode stage for decoding the remaining bits of said memory address signal to select a memory cell in said group corresponding to said remaining bits of said memory address signal; and a plurality of select means, one selecting means associated with each of said groups of memory cells and connected to the second decode stage associated with its group of memory cells, each of said selecting means enabled by the output of said first decode stage specifying its associated group of memory cells, for selecting the memory cell specified by said second decode stage responsive to said mode select signal indicating said normal write mode, and for selecting a predetermined plurality of memory cells within said group responsive to the mode select signal indicating said block write mode; and data input means, for receiving and for writing said input data to the selected memory cells of said specified group.

2. The memory device of claim 1, further comprising:
alternate cell address input means, for receiving a cell address signal, said cell address signal for specifying the predetermined plurality of memory cells within the group specified by said selected bits in said memory address signal to be written by said data input means in said block write mode.

3. The memory device of claim 1, wherein said data input means comprises:
a data input terminal for receiving input data; and
a register for storing input data received by said data input terminal;
buffer means, connected to said array, for writing the contents of said register to the selected memory cells in said group of memory cells selected by said address decoder.

4. The memory device of claim 3, wherein said data input terminal is also for receiving a cell address signal, said cell address signal for specifying the predetermined plurality of memory cells within the group specified by said selected bits in said memory address signal to be written by said data input means in said block write mode.

5. The memory device of claim 4, wherein said data input means writes the input data received by said data input terminal to the selected memory cell in said specified group in said normal write mode;
and wherein said data input means writes the contents of said register to the selected plurality of memory cells in said specified group in said block write mode.

6. A memory device having a normal write mode and a block write mode, comprising:
an array of read/write memory cells, arranged in rows and columns;
mode select means, for receiving a mode select signal indicating said normal write mode or said block write mode;
a row address decoder, for selecting a row of said memory cells in said array responsive to a row address signal;
a column address decoder, for decoding a column address signal, comprising:
a first column decode stage for decoding selected bits in said column address signal, said selected specifying a group of columns of memory cells in said array;
a second column decode stage associated with each of said groups of columns, said second decode stage for decoding the remaining bits of said column address signal to select a column in said group corresponding to said remaining bits of said column address signal; and a plurality of selecting means, one selecting means associated with each of said groups of columns and connected to the second column decode stage associated with its group of columns, each of said selecting means enabled by the output of said first column decode stage specifying its associated group of columns, for selecting the column specified by said second decode stage responsive to said mode select signal indicating said normal write mode, and for selecting a predetermined plurality of columns within said group responsive to the mode select signal indicating said block write mode; and data input means, for receiving and for writing said input data to the selected memory cells, said selected memory cells being in the selected column or columns in the selected row.

7. The memory device of claim 6, further comprising:
alternate column address input means, for receiving an alternate column address signal, said alternate column address signal for specifying the predetermined plurality of columns within the group specified by said selected bits in said column address signal to be written by said data input means in said block write mode.

8. The memory device of claim 6, wherein said data input means comprises:
a data input terminal for receiving input data; and
a register for storing input data received by said data input terminal;
buffer means, connected to said array, for writing the contents of said register to the selected memory cells.

9. The memory device of claim 8, wherein said data input terminal is also for receiving an alternate column address signal, said alternate column address signal for specifying the predetermined plurality of columns within the group specified by said selected bits in said column address signal to be written by said data input means in said block write mode.

10. The memory device of claim 9, wherein said data input means writes the input data received by said data input terminal to the selected memory cell in said normal write mode;
and wherein said data input means writes the contents of said register to the selected memory cells in said block write mode.

11. A memory device, comprising:
a plurality of arrays of read/write memory cells, each array arranged in rows and columns;
a plurality of data input terminals, each of said data input terminals associated with one of said arrays of memory cells;
mode select means, for receiving a mode select signal indicating said normal write mode in said block write mode;
a row address decoder, for selecting a row of said memory cells in each array responsive to a row address signal;
a column address decoder, for decoding a column address signal, comprising:
a first column decode stage for decoding selected bits in said column address signal, said selected bits specifying a group of columns of memory cells in each array;

a second column decode stage associated with each of said groups of columns, said second decode stage for decoding the remaining bits of said column address signal to select a column in said group corresponding to said remaining bits of said column address signal; and a plurality of selecting means, one selecting means associated with each of said groups of columns and connected to the second column decode stage associated with its group of columns, each of said selecting means enabled by the output of said first column decode stage specifying its associated group of columns, for selecting the column specified by said second decode stage responsive to said mode select signal indicating said normal write mode, and for selecting a predetermined plurality of columns within said group responsive to the mode select signal indicating said block write mode; and writing means, connected to said data input terminals, for writing the input data received by said data input terminals to the selected memory cells, said selected memory cells being in the selected column or columns in the selected row, wherein the selected memory cells in each array are written with the input data received by the data input terminal associated with its array.

12. The memory device of claim 11, further comprising:

an input data register, connected to said data input terminals, for storing data received by said data input terminals;

wherein said data input terminals are also for receiving an alternate column address signal, said alternate column address signal for specifying the predetermined plurality of columns within the group specified by said selected bits in said column address signal to be written by said writing means in said block write mode.

13. The memory device of claim 12, wherein said writing means writes the data received by said data input terminals to the selected memory cells in said normal write mode;

and wherein said writing means writes the contents of said input data register to the selected memory cells in said block write mode.

14. The memory device of claim 11, further comprising:

a mask code register for storing a write mask code;

wherein said writing means is connected to said mask code register, and inhibits the writing of data to memory cells in selected ones of said arrays, said selected ones of said arrays determined by the write mask code.

15. The memory device of claim 14, wherein said mode select means is further for receiving a mask select signal indicating whether or not said writing means is to inhibit the writing of selected ones of said arrays responsive to said write mask code.

16. The memory device of claim 15, further comprising:

a first control terminal;

a clock terminal for receiving a clock signal;

wherein said mode select means comprises:

a first special function latch, having its data input connected to said first control terminal and having its clock input responsively coupled to said clock terminal, the output of said first special function latch being said mode select signal; and control logic, connected to the output of said first special function latch and to said plurality of selecting means, for controlling said selecting means responsive to the contents of said first special function latch.

17. The memory device of claim 16, further comprising:

a second control terminal;

wherein said mode select means further comprises:

a second special function latch, having its data input connected to said second control terminal and having its clock input responsively coupled to said clock terminal, the output of said second special function latch being said mask select signal;

and wherein said control logic is further connected to said writing means, for controlling whether or not said write mask code is to selectively inhibit the writing of data, responsive to the contents of said second special function latch.

* * * * *